United States Patent
Cecchi et al.

[11] Patent Number: 5,587,038
[45] Date of Patent: Dec. 24, 1996

[54] APPARATUS AND PROCESS FOR PRODUCING HIGH DENSITY AXIALLY EXTENDING PLASMAS

[75] Inventors: Joseph L. Cecchi; James E. Stevens, both of Albuquerque, N.M.

[73] Assignee: Princeton University, Princeton, N.J.

[21] Appl. No.: 261,853

[22] Filed: Jun. 16, 1994

[51] Int. Cl.⁶ .................................................. C23F 1/02
[52] U.S. Cl. ..................... 156/345; 156/643.1; 216/67; 216/68; 118/723 I
[58] Field of Search ................. 156/345, 643.1; 216/67, 68, 71; 118/723 I, 231 IR

[56] References Cited

U.S. PATENT DOCUMENTS

| | | | |
|---|---|---|---|
| 4,810,935 | 5/1989 | Boswell | 315/11.41 |
| 4,948,458 | 8/1990 | Ogle | 156/643 |
| 4,990,229 | 2/1991 | Campbell et al. | 204/298.06 |
| 5,111,111 | 5/1992 | Stevens et al. | 315/111.41 |
| 5,146,137 | 9/1992 | Gesche et al. | 315/111.21 |
| 5,225,740 | 7/1993 | Ohkawa | 315/111.21 |
| 5,226,967 | 7/1993 | Chen et al. | 156/345 |
| 5,231,334 | 7/1993 | Paranjpe | 156/111.21 |
| 5,261,962 | 11/1993 | Hamamoto et al. | 118/723 |
| 5,270,266 | 12/1993 | Hirano et al. | 156/345 |
| 5,304,279 | 4/1994 | Coultas et al. | 156/345 |
| 5,397,962 | 3/1995 | Moslehi | 315/111.51 |
| 5,421,891 | 6/1995 | Campbell et al. | 156/345 |
| 5,433,812 | 7/1995 | Cuomo et al. | 156/345 |

FOREIGN PATENT DOCUMENTS

| 379828 | 8/1990 | European Pat. Off. . |
|---|---|---|
| 01130531 | 5/1989 | Japan . |

OTHER PUBLICATIONS

M. W. Horn et al.; A Comparison of Etching Tools for Resist Pattern Transfer (1992); SPIE vol. 1672 *Advances in Resist Technology and Processing IX*; pp. 448–460.

*Primary Examiner*—R. Bruce Breneman
*Assistant Examiner*—G. Goudreau
*Attorney, Agent, or Firm*—Bell, Seltzer, Park & Gibson, P.A.

[57] ABSTRACT

A high density elongated plasma is produced by the interaction of an electrically conductive planar antenna located outside of a processing chamber, and a magnetic field generating means, also located outside of the processing chamber. A magnetic field perpendicular to the plane of the antenna is generated within the processing chamber by the magnetic field generating means. The antenna is electrically coupled to a radio frequency power source to generate a helicon wave in the processing chamber to produce a plasma of a gas in the processing chamber. The magnetic field generated by the magnetic field generating means elongates the plasma within the processing chamber.

18 Claims, 7 Drawing Sheets

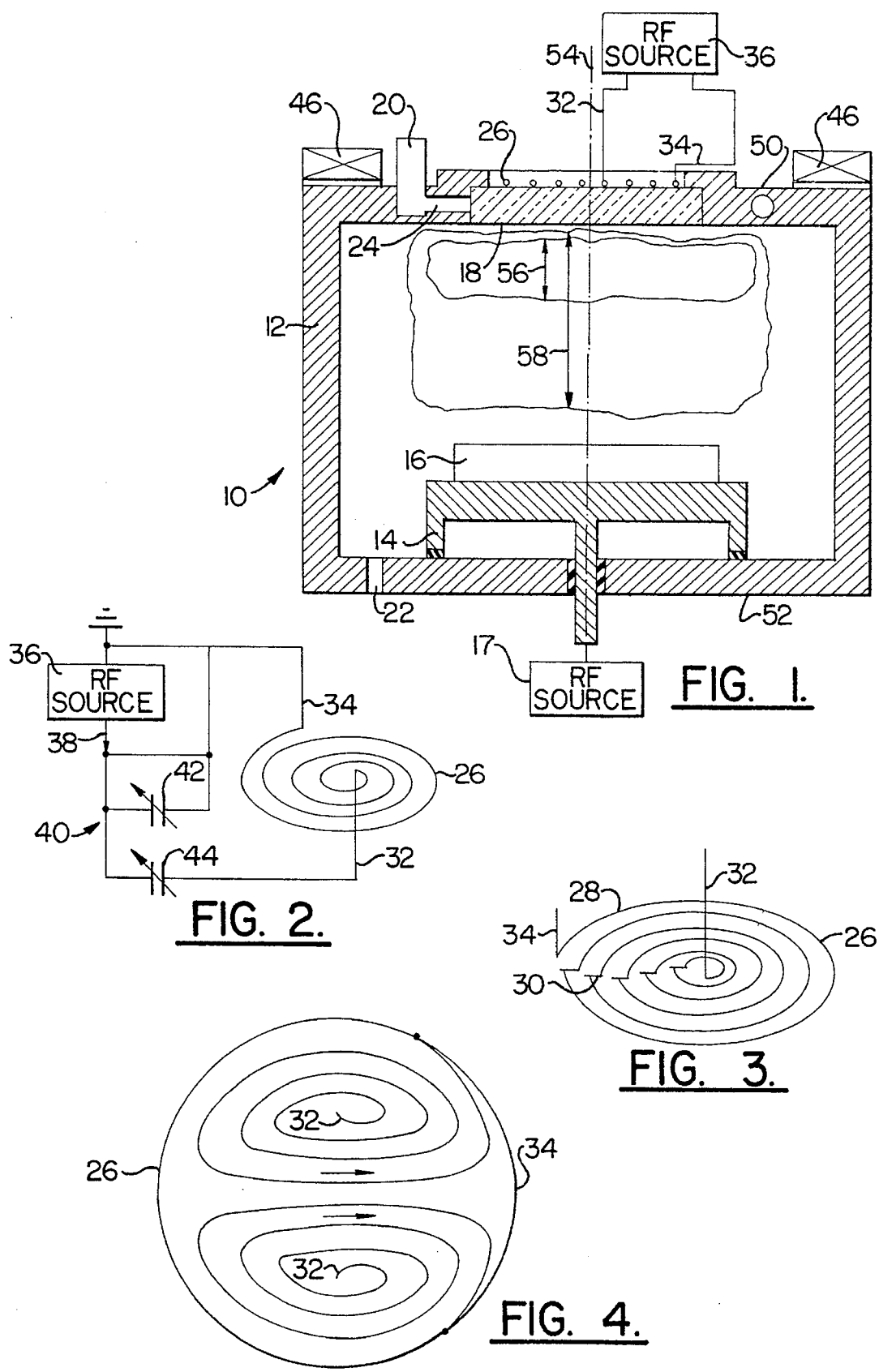

APPARATUS AND PROCESS FOR PRODUCING HIGH DENSITY AXIALLY EXTENDING PLASMAS

FIELD OF THE INVENTION

The present invention relates to a process and apparatus for processing a microelectronic substrate, and more particularly to a process and apparatus for producing a high density axially extended plasma for processing a microelectronic substrate.

BACKGROUND OF THE INVENTION

Plasma generation is useful in a variety of microelectronic fabrication processes, including etching, resist stripping, passivation, deposition, and the like. There are a variety of plasma techniques known for processing microelectronic devices. Most known applications for using plasma can be significantly enhanced if the density of the plasma can be increased and maintained at low pressures, particularly with increasing miniaturization of features of microelectronic devices.

For example, plasma etching is a technique known in the art for patterning a substrate surface to form microelectronic devices and their interconnections. Ideally, substrates are etched primarily in a direction orthogonal to the surface thereof, i.e., in a direction perpendicular to the surface of the substrate. As a material is etched, walls are formed in the material, generally referred to as sidewalls. Ideally etching continues in a substantially vertical direction to the substrate and not laterally into the thus created sidewalls. Such vertical etching with minimal or no lateral etching into the sidewalls is referred to as anisotropic etching.

Plasmas pattern substrates by using directed ions to achieve anisotropic etching. To provide ions with sufficient directionality requires plasma operation at low pressures, typically about 1–20 mTorr. This prevents scattering of the ions by collisions with the gas molecules. Further, it is advantageous to operate plasma processes at high rates for commercial viability. This necessitates the use of high density plasmas.

Currently, several techniques can be used to generate high density plasmas at low pressures. For example, plasma sources such as electron cyclotron (ECR), helicon or MORI, and inductively coupled (RFI/TCP/ICP) sources are becoming increasingly important for plasma processing applications due to their ability to operate at low pressure and high plasma density. ECR processes couple a microwave energy source with a magnetic field to create electron cyclotron resonance in the electrons of a gas to generate a plasma of the gas. This, however, can require high outputs of energy to maintain the plasma. That is, ECR sources typically operate at 2.45 GHz and require an 875 Gauss magnetic field with its attendant costs for coils, power supplies, cooling, and power.

Other techniques generate a plasma by generating helicon or whistler waves in a gas. The helicon waves can be formed by coupling a magnetic field with RF energy, using complicated, large volume antenna structures. This in turn requires complex and large scale reactor design. For example, helicon sources typically use antenna structures external to a cylindrical plasma column to set up either an m=0 or m=±1 mode with a well defined parallel wavelength. This geometry usually necessitates a separate source and downstream processing chamber. Helicon sources typically operate at magnetic fields of 100–400 Gauss because the plasma density, magnetic field, and wavenumber are linked by the helicon dispersion relation.

Still other techniques use inductively coupled plasma sources, which include a flat coil as the coupling element to generate the plasma. Compact reactors can be constructed from inductively coupled plasma generators. However, the plasma is generated near the window and typically has a planar, or "pancake" shape. This can result in small degree of selectivity in etching operations, because of the small chemical reaction surface area of the chamber. RFI/TCP sources with flat spiral coils couple power primarily inductively to the plasma with the RF power deposited primarily within half a skin depth (approximately 0.5–4 cm) of the window, while ECR and helicon sources are wave supported and deposit their power in the plasma bulk.

U.S. Pat. No. 4,810,935 to Boswell discloses a method and apparatus for producing large volume, uniform, high density magnetoplasmas for treating (e.g., etching) microelectronic substrates. The high density plasma is generated using whistler or helicon waves. The plasma is created in a cylinder. A coil is wrapped about the cylinder to create a magnetic field in the cylinder. An antenna is located alongside the cylinder. RF energy, the source of power used to establish the plasma, is coupled to the cylinder by the antenna.

U.S. Pat. No. 4,990,229 to Campbell et al. discloses another apparatus for forming a high density plasma for deposition and etching applications. Again, whistler or helicon waves are used to generate the plasma. The apparatus includes a cylindrical plasma generator chamber. A pair of coils produce an axial magnetic field within chamber. An antenna is mounted on the chamber, to launch RF waves at low frequency along the magnetic field. The plasma is transported by the magnetic field to a separate processing chamber.

U.S. Pat. No. 5,225,740 to Ohkawa discloses a method and apparatus for producing high density plasma using helicon or whistler mode excitation. The high density plasma is produced in a long cylindrical cavity imbedded in a high magnetic field, generated by a coil wound around the plasma chamber. In one embodiment, electromagnetic radiation is coupled axially into the cylindrical cavity using an adjustable resonant cavity to excite a whistler wave in the cylindrical cavity and hence in the plasma. In another embodiment, electromagnetic radiation is coupled radially into the cylindrical cavity using a slow wave structure to excite the whistler wave in the plasma. In both embodiments, the plasma is generated without using electrodes.

U.S. Pat. No. 5,146,137 to Gesche et al. discloses a device for the generation of plasma by means of circularly polarized high frequency waves, such as whistler and helicon waves. The apparatus includes a plasma chamber having an upper cylinder and a lower cylinder, an antenna, and a coil, both of which are placed about the upper cylinder. The coil creates a magnetic field. The antenna generates waves which are coupled through the magnetic field in the plasma in the helicon state. Four electrodes generate an electromagnetic field. First and second voltages, which are phase-sifted by 90°, are applied to opposing pairs of electrodes to develop the helicon wave.

U.S. Pat. No. 4,948,458 to Ogle discloses an inductively coupled plasma apparatus. The apparatus includes a generally air tight interior chamber within which the plasma is generated. To induce the desired plasma, an electrically conductive coil is disposed adjacent to the exterior of the enclosure. The coil is substantially planar, including a single conductive element formed into a planar spiral or a series of concentric rings. By inducing a radio frequency current within the coil, a magnetic field is produced which will induce a generally circular flow of electrons within a planar region parallel to the plane of the coil.

Despite these and other plasma processing techniques and apparatus, there exists a need for a plasma process and apparatus which can be used to produce and maintain high density plasma under low pressure conditions. Further, it would be desirable to provide such plasmas without requiring high outputs of energy to maintain the plasma or requiring complicated, large volume antenna structures, and thus complex and large scale reactor design. In addition, it would be desirable to provide an apparatus which includes a single chamber in which the plasma can be generated and the microelectronic substrate processed, and which includes a large chamber wall surface area, and thus a large chemical reaction surface area, to thereby increase the degree of selectivity in etching operations at low pressures.

SUMMARY OF THE INVENTION

It is therefore an object of the present invention to provide an apparatus and process for producing a high density plasma.

It is another object of the present invention to provide an apparatus and process for producing a high density plasma for processing samples, such as microelectronic substrates.

It is another object of the present invention to provide an apparatus and process for producing a high density plasma for processing semiconductor substrates without requiring high outputs of energy to maintain the plasma.

It is yet another object of the present invention to provide an apparatus and process for producing a high density plasma for processing microelectronic substrates without requiring complicated, large volume antenna structures, and thus complex and large scale reactor design.

It is yet another object of the present invention to provide an apparatus and process for producing a high density plasma for processing microelectronic substrates which includes a large chamber wall surface area, and thus a large chemical reaction surface area, to thereby increase the degree of selectivity in etching operations at low pressures.

These and other objects are provided according to the present invention by an apparatus and process for producing high density plasmas within a single processing chamber by the interaction of an electrically conductive substantially planar antenna located outside of the processing chamber, and a magnetic field generating means, also located outside of the processing chamber. Radio frequency (RF) current is made to flow through the antenna by supplying a RF voltage from an RF power supply or generator. The substantially planar antenna can be, for example, a planar coil arranged as a spiral or as a series of concentric rings. Alternatively, the planar antenna can be a planar coil arranged as a double spiral.

The RF energy from the antenna excites the gaseous medium within the chamber to form a helicon or whistler wave within the gas. This generates the high density plasma. The magnetic field generating means generates a magnetic field within the processing chamber, the magnetic field being perpendicular to the plane of the antenna. This magnetic field causes elongation or axial extension of the high density plasma, i.e., the helicon wave is propagated along the magnetic field lines.

Thus the interaction of the planar antenna and the magnetic field results in the formation, maintenance, and propagation of a helicon wave sustained plasma within the processing chamber. This plasma can be used in a variety of processing applications, such as deposition, etching, and the like.

The present invention provides advantages over prior techniques without the corresponding problems associated therewith. The end launch configuration of the present invention differs from previous helicon sources in that the parallel wavelength is not defined by the antenna. The RF power absorption and the plasma generation are remote from the reactor walls, only a modest magnetic field is required (which can be reduced to zero near the substrate), and the configuration is compact. Further, the reactor configuration allows the aspect ratio (height/diameter) to be increased as compared to a purely inductively coupled reactor without sacrificing plasma density at the substrate. This can be advantageous in improving processing conditions with regard to pumping speed, reaction product exhaust, control of the wall chemistry, and the like.

In addition, by applying a magnetic field perpendicular to the planar antenna, the helicon wave plasma can be elongated or axially extended within the processing chamber. As a result, a larger processing chamber can be used. This in turn provides a greater amount of chamber wall surface area for plasma chemical reactions to take place, thus increasing the selectivity of the particular process.

In contrast, ECR tools require large scale magnets to generate the necessary large magnetic field, in the range of 875 Gauss, and thus require high outputs of energy, high operating costs, etc. Prior tools used to generate helicon plasmas have used complex antenna structures thought necessary to generate the desired helicon wave configuration. Inductively coupled plasma tools produce flat plasmas, with limited selectivity and the like.

BRIEF DESCRIPTION OF THE DRAWINGS

In the drawings which form a portion of the original disclosure of the invention:

FIG. 1 is a side cross-sectional view of a plasma processing apparatus in accordance with the present invention;

FIG. 2 is a perspective view of one embodiment of a planar antenna electrically coupled to a RF source;

FIG. 3 is a perspective view of another embodiment of a planar antenna;

FIG. 4 is a top plan view of yet another embodiment of a planar antenna;

DETAILED DESCRIPTION OF THE INVENTION

Figure 5A:
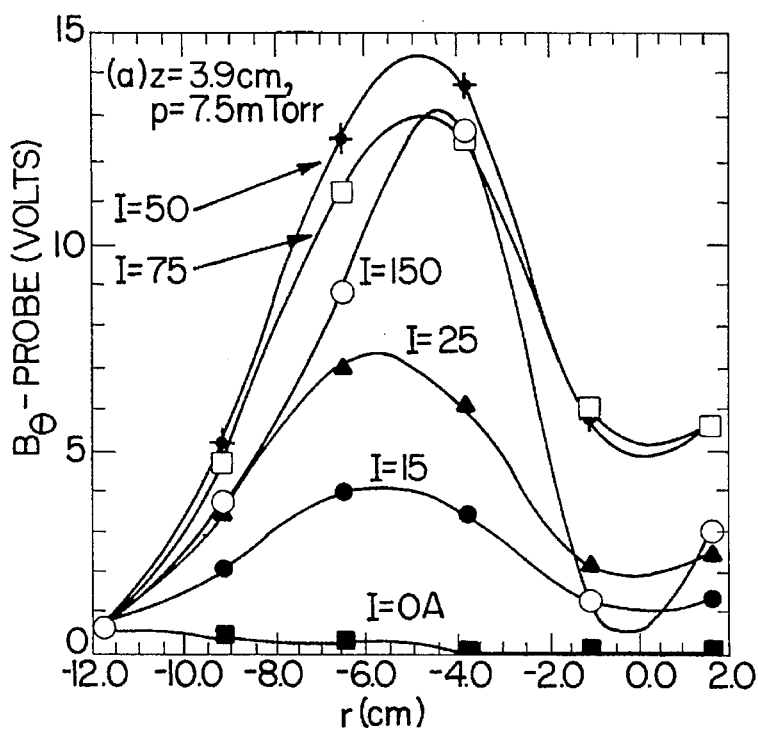
FIGS. 5a, 5b, and 5c are graphs illustrating radial profiles of $B_\theta$-probe voltage (peak-to-peak) versus: (a) coil current for p=7.5 mTorr and z=3.9 cm; (b) axial distance z from a dielectric window in the apparatus of the invention for p=7.5 mTorr and I=50 A; and (c) pressure for z=6.4 cm and I=50 A, respectively.

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that the disclosure will be thorough and complete, and will fully convey the scope of the invention to those skilled in the art. Like numbers refer to like elements throughout. For purposes of clarity the scale has been exaggerated.

FIG. 1 illustrates a side cross sectional view of a plasma processing apparatus or tool in accordance with the present invention, designated generally as 10. The plasma processing tool includes a processing chamber 12, having first and second opposing ends 50 and 52, which defines a generally air-tight interior chamber within which the plasma is generated and within which a substrate to be processed is treated. The chamber is preferably circularly symmetric about an axis 54. One or more support surfaces or chucks 14 are provided within the interior of the process chamber 12 for supporting a substrate 16 to be treated, such as a semiconductor wafer or other microelectronic device. The chuck may be connected to a radio frequency source 17 which provides a biasing potential to the chuck. In addition, techniques known in the art can be used to control the substrate temperature during processing.

The processing chamber 12 includes in at least one wall thereof a dielectric window or shield 18. The dielectric window 18 provides a vacuum seal for the processing chamber 12, and allows penetration therethrough of electric and magnetic fields generated as described in more detail below. The dielectric window 18 is preferably formed of quartz, although other dielectric materials known in the art can be used. The thickness of the dielectric window 18 is not critical, and is selected to be sufficient to withstand the differential pressure created by a vacuum within the processing chamber 12.

The processing chamber also includes a gas inlet port 20 for introduction of a process gas and an outlet port 22 for exhaustion or removal of the gas and reaction products. The gas can comprise a single component or a mixture of gas components, and is selected according to the type of etching or surface treatment of the substrate that is required. For example, in processing silicon dioxide ($SiO_2$) substrates, a hydrocarbon gas, or a halogenated hydrocarbon gas, such as $CH_4$, $CHF_3$, and the like, can be used.

Techniques and apparatus of supplying a process gas within the interior of the process chamber 12 are well known in the art. The location of inlet port 20 is not critical and gas can be introduced at any point which provides for the even distribution of the gas within the processing chamber. For example, as illustrated in FIG. 1, to enhance the uniformity of gas distribution, a distribution ring 24 as known in the art can be used. Typically such a gas distribution ring will include an annular member and a series of ports distributed substantially equally around the ring and extending from the annular member to the open center of the ring. This arrangement is such that a uniform flow of gas is directed toward the chuck 14. When present such a ring is advantageously located opposite from the substrate chuck 14 and adjacent the dielectric window 18.

A plasma is established within chamber 12 by establishing a magnetic field within processing chamber 12 and coupling radio frequency energy into the gas within chamber 12 using an RF antenna as described below. The RF energy from the antenna excites the gaseous medium within the chamber 12 to form a helicon wave within the plasma. This helicon wave is then propagated along the magnetic field lines. This generates an elongated high density plasma, i.e., a plasma which is axially extended along axis 54. As used herein, the term "high density plasma" refers to a plasma having a density above about $1\times10^{11}$ $cm^{-3}$.

To induce the desired plasma, an electrically conductive, substantially planar antenna 26 is provided outside the processing chamber 12 adjacent the dielectric window 18. Antenna 26 can comprise a single conductive element formed into a substantially planar spiral as illustrated in FIG. 2. Alternatively, antenna 26 can comprise a single conductive element formed into a series of concentric rings, as illustrated in FIG. 3. In FIG. 3, planar antenna comprises a series of concentric loops 28, where each succeeding loop is connected by a short transverse member 30. In yet another embodiment of the invention, antenna 26 can comprise a substantially planar double coil antenna, as illustrated in FIG. 4. Other antenna configurations can be used in accordance with the present invention, for example a solid disc-like planar electrode. With a solid disc-like planar electrode, the dielectric window should be very thin, i.e., less than about 1 millimeter, or be replaced by a dielectric feed through behind the solid electrode.

The specific configuration of the antenna 26 is selected based upon the particular desired plasma wave configuration, which in turn can be based upon the particular processing required, i.e., deposition, etching, etc., substrate material, and the like. For example, the antenna configurations of FIGS. 2 and 3 are particularly useful in launching a m=0 mode helicon wave configuration. Alternatively, the antenna configuration of FIG. 4 is particularly useful for launching a m=±1 mode helicon wave in the plasma generated in processing chamber 12.

As illustrated in FIGS. 1, 2, and 3, the antenna includes a center tap 32 and an outer tap 34. Radio frequency (RF) current is made to flow through antenna 26 by applying an RF voltage between center tap 32 and outer tap 34. The outer tap 34 is shown as a circuit ground in FIG. 2. Alternatively, tap 34 can be the driven side and tap 32 can be the ground. In addition, each of taps 32 and 34 can be capacitively isolated from ground so as to adjust the capacitive coupling of antenna 26.

The RF voltage is applied from an RF power supply or generator 36. The RF generator will typically operate at a frequency from about 0.5 MHz to about 50 Mhz, and preferably at about 13.65 MHz. The RF generator can be any of the types of RF generators known in the art for the operation of microelectronic substrate processing equipment.

As best illustrated in FIG. 2, the RF voltage passes from generator 36 through a cable 38 to a matching box or circuit 40, and the output is coupled to the planar antenna 26, which in turn resonantly couples the RF power into the gaseous medium within the chamber 12. Matching box 40 typically includes two variable capacitors 42 and 44. The capacitors are provided to adjust the circuit resonance frequency with the frequency output of the RF generator. Impedance matching maximizes the efficiency of power transfer to the planar antenna 26, and thus coupled into the plasma, and minimizes the power that is reflected back along the cable to the RF power supply.

The skilled artisan will appreciate that other circuit designs can be used for resonantly tuning the operation of the planar antenna 26 and for matching the impedance of the antenna with the RF generator.

Inducing a radio frequency current within the antenna 26 creates a RF or oscillating magnetic field. The magnetic field penetrates the dielectric window of chamber 12 in the form of a helicon wave. The helicon wave induces plasma formation within the gaseous medium within chamber 12 by energizing or exciting the electrons of the gas.

The antenna 26 is adapted to couple the radio frequency power into the gas in processing chamber 12 to thereby generate the plasma. The plane of the antenna 26 is oriented substantially parallel to the dielectric window 18 and the chuck 14 within processing chamber 12. The planar antenna can be placed close to the dielectric window, preferably from about 0.5 mm to about 2 mm from the window, and can be touching the dielectric window. The antenna 26 advantageously can be up to about 5 centimeters or greater from chuck 14. The skilled artisan will recognize that these exact distances can vary depending upon the particular application.

The planar antenna 26 will generally be circular, although ellipsoidal patterns, such as that illustrated in FIG. 4, and other deviations from true circularity can be used. The antenna is substantially planar, although deviations from true planarity can also be tolerated. Adjustments to the profile of the antenna may be made to modify the shape of the electric field which is capacitively coupled to the plasma.

The diameter of the antenna 26 will generally correspond to the size of the plasma to be generated. Advantageously, the diameter of the antenna is from about 10 centimeters to about 30 centimeters. The diameter of the antenna can be greater or smaller depending upon for example the size and number of substrates to be treated. For example, to treat a single 8 inch diameter substrate, the diameter of the antenna 26 can range from about 6 centimeters to about 10 centimeters.

The number of turns of antenna 26 is dependent upon other factors, such as the diameter of the antenna, the number of substrates to be treated, whether the antenna is a single or double coil, the desired inductance, and the like. For example, using a single coil antenna as illustrated in FIG. 2 to treat a single substrate, the antenna can include about 2 to about 4 turns, although this number can be greater or smaller.

The planar antenna 26 is constructed of any electrically conductive metals, typically copper. In addition, antenna 26 can be hollow to allow for water or air cooling. The antenna can have a current carrying capacity from about 5 to 30 amps.

As noted above, the desired plasma is generated by the apparatus of the invention by coupling the RF power from antenna 26 into the gaseous medium of chamber 12 with a magnetic field substantially perpendicular to the plane of the antenna 26. In the apparatus of the invention, the magnetic field is generated by magnetic field generating means 46 positioned outside of the processing chamber 12. Magnetic field generating means 46 can be any of the types of devices known in the art for generating a magnetic field in plasma processing applications, for example, a coil about the exterior of processing chamber 12, a set of permanent magnets, and the like. The axes of planar antenna 26, magnetic coil 46 and chuck 14 are generally parallel to one another and preferentially colinear with the axis 54 of chamber 12.

The strength of the magnetic field produced by magnetic field generating means can vary. The process of the invention is effective with magnetic fields as low as 5 Gauss. Stated differently, magnetic field generating means 46 can be used to generate an axial magnetic field having a strength of about 5 Gauss or greater in processing chamber 12. For example, the axial magnetic field can have a strength of about 5 Gauss for the standard RF frequency of 13.56 Mhz.

When the helicon wave plasma is induced by antenna 26, the magnetic field elongates or axially extends the plasma in the chamber along axis 54. Stated differently, when no magnetic field is present, planar antenna 26 induces a plasma having a first thickness 56 as designated in FIG. 1. The magnetic field generated by magnetic field generating means 45 elongates or axially extends the plasma production region along axis 54 to produce a plasma having a second thickness, designated generally as 58 in FIG. 1, which is greater than the first thickness 56. As a result, a larger chamber can be used, which in turn provides a greater amount of chamber wall surface area for plasma chemical reactions to take place.

This is advantageous for the reasons described below. Plasma processes, such as ECR, helicon, inductively coupled plasma, and the like, can provide high density plasmas at low pressures. However, other problems arise with the use of such plasmas, for example, with etching of silicon dioxide. The oxide should be selectively etched with respect to the silicon so that silicon is not removed in the process. Accordingly, the rate of oxide etching advantageously is about 20 to 30 times that for silicon. Etching of oxide typically uses a fluorocarbon chemistry, such as $CHF_3$. The plasma will dissociate the $CHF_3$ or other input gas and produce a variety of fluorocarbon species, along with F and H. To achieve the desired selectivity and oxide etch rate, it is necessary to form certain fluorocarbon species in the plasma (such as $CF_3$, although the exact identity of such species is not known) and to minimize the F concentration.

Prior etching processes run at high pressures have achieved this by gas phase reactions in the volume of the plasma to "scavenge" F, typically by reacting F with H to form HF. This is believed to also lead to the formation of desired fluorocarbon species to assist with selectivity.

At low pressures, however, the gas phase reactions are much slower. This is believed to be due to the fact that at low pressures, the gas densities are lower, so that the reactions are much less frequent. As a result, the gas phase reactions are believed to be ineffectual at low pressures in reducing the F concentration and producing the desired fluorocarbon for selectivity.

It is believed possible to remove F by reactions occurring on the walls of a plasma reaction or processing chamber which contains the substrate. These reactions are believed to be increasingly more effective as the area of the chamber walls is increased. Therefore, at low pressures, as necessitated by processing of increasingly smaller devices, it is desirable to have a larger reactor surface area for controlling the plasma chemistry. In the present invention, because the walls of the reaction chamber can be extended, a greater surface area is provided on which the gas in the plasma can catalyze to form the desired chemical species for processing.

This is advantageous for increasing selectivity in processing. In addition more wall space is available for pump ducts to exhaust the reaction products.

The operating pressure is dependent upon the particular process being performed. The range of pressures in which the plasma can be generated is broad, ranging from about 1 mTorr to about 1 Torr. Processes and apparatus for maintaining a desired pressure within the interior of the processing chamber are known in the art.

Quantitative Description

A description of the present invention for a particular set of parameters (rf frequency, pressure, magnetic field) will now be provided. A much wider range of rf frequency, pressure and magnetic field parameters can also be used in accordance with the present invention.

In the absence of magnetic fields, RF fields are expected to penetrate on the order of a skin depth into the plasma, $\delta \sim c/\omega_{pe} \sim 0.5$ cm/$(n_e \times 10^{-12}$ cm$^{-3})^{1/2}$, where $\omega_{pe} = (4\pi n_e e^2/m_e)^{1/2}$ is the plasma frequency, and $n_e$ is the plasma density. The presence of a magnetic field allows a whistler mode to propagate. The free space cold plasma dispersion equation for the whistler mode is approximately $$n^2 \approx \omega_{pe}^2/\omega^2/[(\omega_{ce}/\omega)(k_{\parallel}/k)-1], \qquad \text{Eq. (1)}$$

where $n = ck/\omega$ is the index of refraction of the wave, $k = 2\pi/\lambda$ is the wavenumber, $k_{\parallel} \approx k$ is the wavenumber parallel to the magnetic field, and $\omega = 2\pi f$ is the wave frequency in radians. At $f = 13.56$ MHz and $n_e = 2.5 \times 10^{11}$ cm$^{-3}$ the quantity $\omega_{pe}^2/\omega^2 \approx 10^5$ while the quantity in square brackets in Eq. (1) varies from $-1$ to 10 for the range of magnetic field of our experiment (0<B<50 G). A bounded whistler with $\omega_{ce} \gg \omega$ is referred to as a helicon mode. The helicon mode exists for arbitrarily high density and propagates for $\omega_{ce}/\omega > 1$. Wave absorption can occur via collisional damping, Landau damping, or electron cyclotron damping depending on the neutral pressure, wave frequency, and the magnetic field. All three terms can be important for the frequency (13.56 MHz), magnetic field (0–50 G), and pressure range (1–100 mTorr) used in this experiment.

Collisional damping is included in Eq. (1) by substituting $m_e(1 = v_c/\omega)$ for $m_e$ in the expressions for $\omega_{pe}^2$ and $\omega_{ce}$. T. Stix, *Waves in Plasma*, AIP, p. 38 (1992). W. M. Hooke et al, Proc. Course on Industrial Applications of Plasma Physics, Varenna, Italy, p. 33 (Sep. 1992), have theoretically addressed the issue of whistler propagation and damping in the high collisionality regime ($v_c \gg \omega$). They point out that $v_c/\omega$ can be much larger than one and still allow the whistler wave to propagate, provided that $v_c < \omega_{ce}$. Furthermore, the imaginary damping term, $iv_c/\omega$, cancels in Eq. (1) to leading order in the regime $\omega_{ce}/\omega \gg 1$. The real part of the dispersion equation is modified as well for large damping rates.

ECR wave penetration in a highly collisional regime was addressed experimentally by T. D. Mantel, et al, *J.Vac. .Sci.Technol.* A10, 1423 (1992), for a 2.45 GHz ECR reactor operating at 10 Torr, who showed that increased penetration occurred for $v_c < \omega_{ce}$. Values of $v_c/\omega \approx p(\text{mTorr})/7.5$ and $v_c/\omega_{ce} \approx 0.64$ $p(\text{mTorr})/B_{Gauss}$ apply to our experiment using argon and an RF frequency of 13.56 MHz. An approximate expression for the collisional damping of the whistler mode is:

$$k_{\parallel i} = k_{\parallel}\{[(1 + v_c^2/\omega^2/(\beta-1)^2)^{1/2} - 1]/ \qquad \text{Eq. (2)}$$
$$[(1 + v_c^2/\omega^2/(\beta-1)^2)^{1/2} + 1]\}^{1/2}$$
$$\approx 0.5 k_{\parallel}(v_c/\omega)/(\beta - 1) \text{ for } v_c/\omega \ll 1,$$

where $\beta = (\omega_{ce}/\omega)$ $(k_{\parallel}/k)$

See W. M. Hooke, et al., supra. The spatial damping of the helicon due to collisionless processes can be derived from linear wave theory. F. Chen, UCLA-IPFR Report, PPG-1317 (Jul. 1990), gives an expression for the Landau damping rate of a helicon in the limit of weak damping as $$k_{\parallel i} = 2\sqrt{\pi} \; k_{\parallel}/[(\beta-1)(1+k_{\parallel}^2/k^2)]\xi_0^3 \exp\{-\xi_0^2\}, \qquad \text{Eq. (3)}$$

where $\xi_0 = \omega/k_{\parallel}v_{re}$. The electron cyclotron resonance introduces a spatial damping given by:

$$k_{\parallel i} \approx \sqrt{\pi} \; \omega_{pe}^2/(2c^2 k_{\parallel})\xi_0 \exp\{-\xi_{-1}^2\}, \qquad \text{Eq. (4)}$$

where $\xi_{-1} = (\omega - \omega_{ce})/k_{\parallel}v_{re}$. See T. Stix, supra. The Doppler broadening of the ECR resonance is large [$k_{\parallel}v_e \approx 1-3\omega_{ce}$] in the regime of this experiment so that both Landau damping (Eq. 3) and electron cyclotron damping (Eq. 4) are important and comparable for $B < 2B_{res}$, where the ECR resonant magnetic field is $B_{res} \approx 4.8$ G for $f = 13.56$ MHz. Higher order resonance's, $\omega + n\omega_{ce}$ where $n = +1, \pm 2$ may also make small contributions to the damping for $B < 2B_{res} \approx 10$ G but are not considered further here. Both the Landau and collisional damping mechanisms fall rapidly with increasing magnetic field. Electron cyclotron damping falls exponentially with magnetic field and exceeds Landau damping only for $B/B_{res} < 2-3$ for the wavenumbers in our experiment ($k_{11} \approx 0.3-1.8$ cm$^{-1}$ and $k_{\perp} \approx 0.37$ cm$^{-1}$). The ratio of collisional to collisionless Landau damping calculated from Eqs. (2) and (3) is $$k_{\parallel i\text{-}coll}/k_{\parallel i\text{-}LD} \gtrsim 0.7 v_c/\omega \approx p(\text{mTorr})/10 \qquad \text{Eq. (5)}$$

to within a factor of two. This estimate assumes an argon plasma and uses the measured wavenumbers in this experiment. An equality in Eq. (5) occurs when Landau damping is maximized around $\xi_0 = \omega/k_{\parallel}v_{re} \approx 1.22$. Thus, neutral pressure is the main factor determining the transition from collisional to Landau damping.

The linear theory for collisionless damping assumes a perturbative, small amplitude wave. However, kilowatt power levels are necessary to generate the plasma and thus the experimental situation is in the nonlinear, "large signal" regime where simple expressions for the damping are not available. Nevertheless, Eqs. 2–4 are useful for comparison with the experimental data and the predictions appear to be good to within a factor of two.

The present invention will be further illustrated by the following non-limiting example.

EXAMPLE

Experimental Setup

The operation of one embodiment of an end launched, closely coupled, helicon plasma source generated by a flat spiral coil was investigated. The apparatus used is illustrated in FIG. 1. The chamber 12 was approximately 48 cm in diameter and 25 cm long. A 25.4 cm diameter by 2.54 cm thick quartz window 18 was located on one end of the vessel with a 20 cm diameter exposed to the plasma. A 25 cm diameter conducting water platen was located opposite the window at a distance of 22.4 cm from the window surface and was operated floating for the experiments reported here. The wafer platen forms chuck 16. RF power is coupled to the plasma through a center-fed, four-turn, water-cooled spiral coil 26 constructed from ¼ inch diameter copper tubing. The coil is positioned approximately 1.5 mm above the quartz window 18. An RF Plasma Products 13.56 MHz generator and automatic matchbox 40 supplied up to 2 kW of RF power. Argon was used for the experiments reported here. Magnetic fields were generated by a 13 turn solenoid coil 46 mounted on the large top flange and operated with up to 150 A and 2 V of dc power.

RF frequency magnetic field probe used in this example measured the $B_\theta$ component of the RF magnetic field and consisted of a single turn loop of a 0.080" diameter coax with an area of approximately 1 cm². The probe could be scanned axially and rotated to distances r approximately ±15 cm from the reactor axis. The voltages from the two coax probe feeds were measured differentially on an oscilloscope. The RF magnetic field ($B_\theta$) is related to the probe volgate, V, by Faraday's law $$|V| = \omega A_p |B_\theta|, \quad \text{Eq. (6)}$$

where $A_p$ is the probe area. Expressions for the electric and magnetic fields of an m=0 helicon mode in a plasma column of uniform density are given by Chen, supra, and are repeated below.

$$B_\theta = A \, k \, J_1(k_\perp r)\sin(\psi) = k_\parallel/\omega E_r \quad \text{Eq. (7)}$$

$$B_r = A \, k_\parallel J_1(k_\perp r)\cos(\psi) = -k_\parallel/\omega E_\theta \quad \text{Eq. (8)}$$

$$B_z = A \, k_\perp J_0(k_\perp r)\sin(\psi) \quad \text{Eq. (9)}$$

where $J_0$ and $J_1$ are Bessel functions, A is an amplitude, and $\psi = k_{11}z - \omega t$ is an arbitrary phase angle. The wave power is related to $|B_\theta|$ by $$P_{rf} = 1/2\omega/(k_\parallel\mu_0)\{1 + k_\parallel^2/k^2\}2\pi \int_0^a r dr |B_\theta|^2, \quad \text{Eq. (10)}$$

where $\mu_0 = 4\pi \times 10^{-7}$ henry/m, and MKS units are used in Eqs. (6–10). The phase of $B_\theta$ is measured relative to a reference signal from the RF generator.

Experimental Results

FIG. 5a shows the radial profiles of the peak-to-peak helicon $B_\theta$ field versus coil current for a pressure of 7.5 mTorr and an axial location of 3.9 cm from the window. Currents of 15 A and above show the characteristic $J_1$ Bessel function profile of the m=0 helicon mode. The probe signal nearly goes to zero on the reactor axis and the phase jumps by 180° as the probe crosses the reactor axis. We would expect the $B_\theta$ signal to peak on axis if we had m=±1 modes. R. W. Boswell, *Plasma Physics and Controlled Fusion* 26, 1147 (1984); F. Chen, supra.

A current of approximately 12.5 A corresponds to a dc magnetic field of $B_{res} = 4.8$ G at the center of the window which is the minimum field required for whistler wave propagation at 13.56 MHz. The radius of the maximum $B_\theta$ signal decreases only slightly at higher currents (magnetic fields) indicating that $k\perp$ is relatively constant. The amplitude decrease at lower currents (I<50 A) is due to stronger absorption at magnetic fields B<20 G. The I=0 case corresponds to an inductively coupled (RFI) configuration in which case the dominant field component is not $B_\theta$ but rather $B_r$ which falls exponentially in an RF skin depth $\delta \approx$ few cm. J. Hopwood, *Plasma Sources Sci. Technol.* 1, 109 (1992).

Figure 5B:
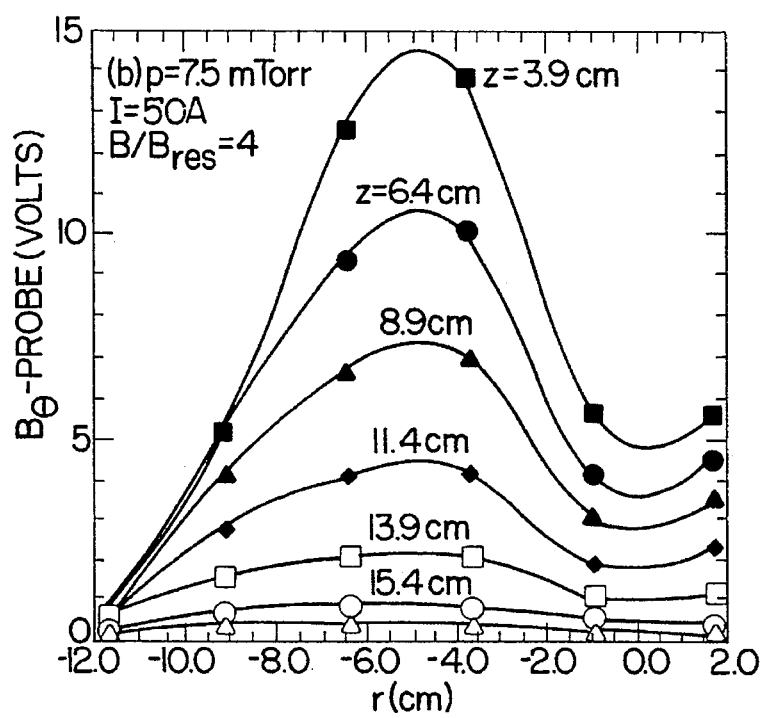

FIG. 5b is a plot of $B_\theta$ versus radius for several axial locations with a pressure of 7.5 mTorr and a current of 50 A ($B_{win}/B_{res} \approx 4$), indicating that there is an axial damping of the RF fields for these conditions. Note that the radius of the peak signal stays approximately fixed at r=5 cm even though the dc magnetic field falls by the factor of ≈3 between the window (z=0 cm) and the substrate location (z=22.4 cm) and the field lines flair substantially.

Figure 5C:
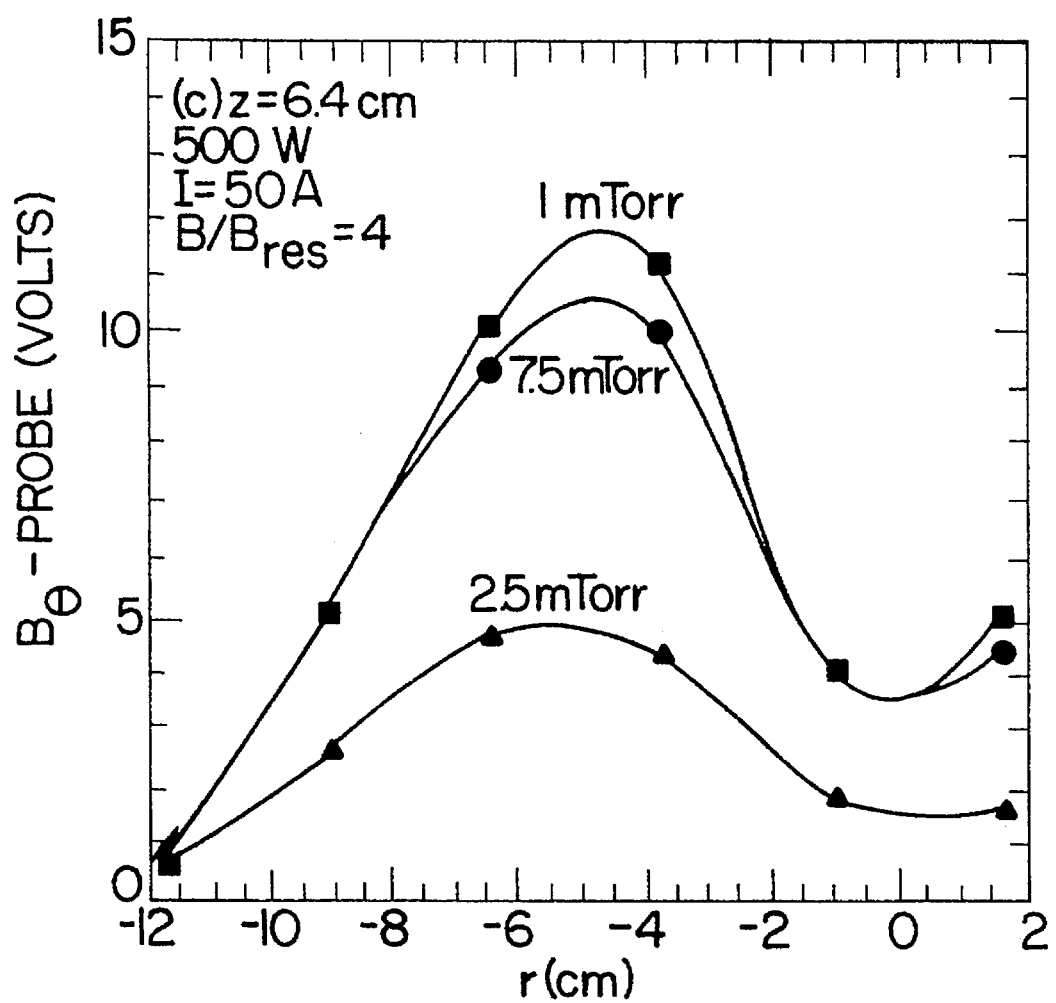

FIG. 5c is a plot of $B_\theta$ versus radius for several pressures taken at z=7.5 cm and I=50 A. Since plasma density increases with pressure, FIG. 5c indicates that the radius of the peak signal also stays approximately fixed with plasma density. Collisional damping is probably responsible for the smaller RF amplitude at 25 mTorr. The helicon mode appears to choose the peak of the $B_\theta$ field to be at approximately 5 cm in the cases studied. This implies $k_\perp \approx 0.37$ cm$^{-1}$ while typically $k_\parallel$ varies in the range of $0.5 < k_\parallel < 2$ cm$^{-1}$.

Figure 6A:
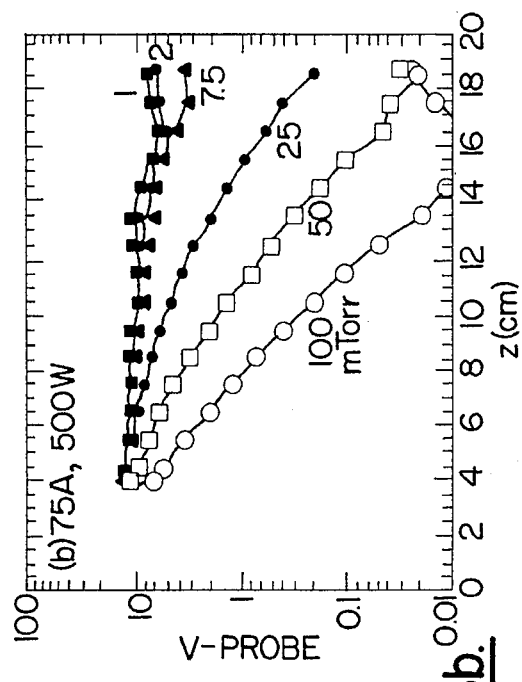
FIGS. 6a and 6b are graphs illustrating axial scans of the $B_\theta$-probe voltage (peak-to-peak) versus pressure with I=25 A and I=75 A, respectively.

FIG. 6a is a plot of the peak-to-peak $B_\theta$-probe voltage versus axial distance for pressures ranging from 1–100 mTorr and a coil current of 25 A ($B_{win} \approx 10$ G). The axial scans were measured at the peak of the radial profile at r≈5 cm. Increasing pressure increases the already strong attenuation of the $B_\theta$ fields at I=25 A. The magnetic field at axial locations z>15.5 cm has fallen below the 4.8 G necessary for helicon mode propagation.

Figure 6B:
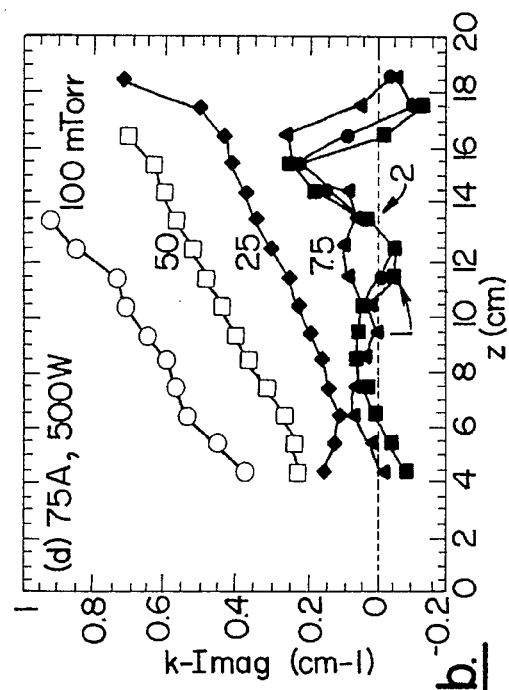

FIG. 6b shows the same scan except for a higher coil current of 75 A ($B_{win} \approx 30$ G). Strong attenuation for this high field sets in above approximately 7.5 mTorr ($\upsilon_c/\omega > 1$; $\upsilon_c/\omega_{ce} > 0.2$). Note that the attenuation increases with axial distance, i.e. decreasing magnetic field, as indicated by the constantly falling slope of the I=25, 50, and 100 A curves as z increases and Bz decreases.

Figure 7A:
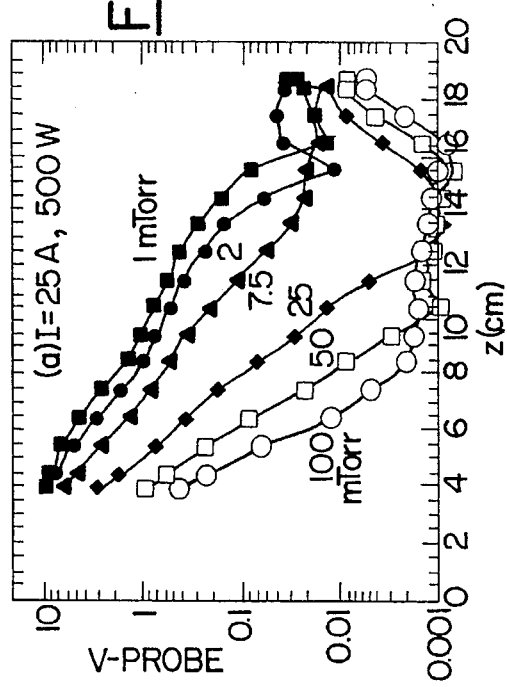
FIGS. 7a and 7b are graphs illustrating (a) the phase versus distance plot, and (b) the imaginary parallel wavenumber ($k_{||i}$) versus distance and pressure, each for the data of FIG. 6b, respectively.
Figure 7B:
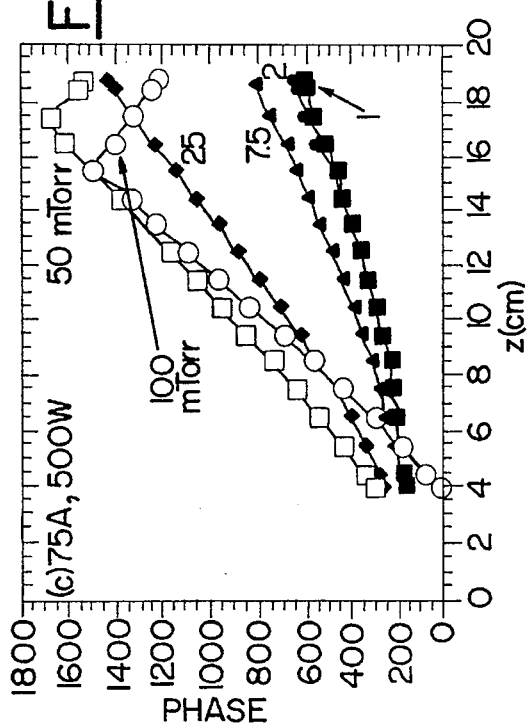

FIG. 7a is a plot of phase versus distance for the data in FIG. 6b for several pressures, and FIG. 7b is a plot of imaginary wavenumber for the same data. The decreasing axial wavelength with pressure is due to an increasing plasma density with pressure, which should go as $\lambda \approx n_e^{-0.5} - n_c^{-1}$, depending on $k_\parallel/k$, according to Eq. (1). Using the slopes in FIG. 7a to determine $k_\parallel$ and taking $k_\perp = 0.37$ cm$^{-1}$, Eq. (1) implies densities of $n_e \approx 2\times 10^{11}$ cm$^{-3}$ at 1 mTorr, $n_c \approx 4\times 10^{11}$ cm$^{-3}$ at 7.5 mTorr, and $n_c \approx 4\times 10^{12}$ cm$^{-3}$ at 100 mTorr. The damping rate changes little between 1–7.5 mTorr in FIGS. 6b and 7b, indicating that collisional damping is weak at those pressures. The damping in FIG. 6a at 1 mTorr pressure with I≈25 A is thus much stronger than expected from collisions ($\upsilon_c/\omega_{ce} \approx 0.1$–0.02) and therefore is believed likely to be due to collisionless damping.

Figure 8A:
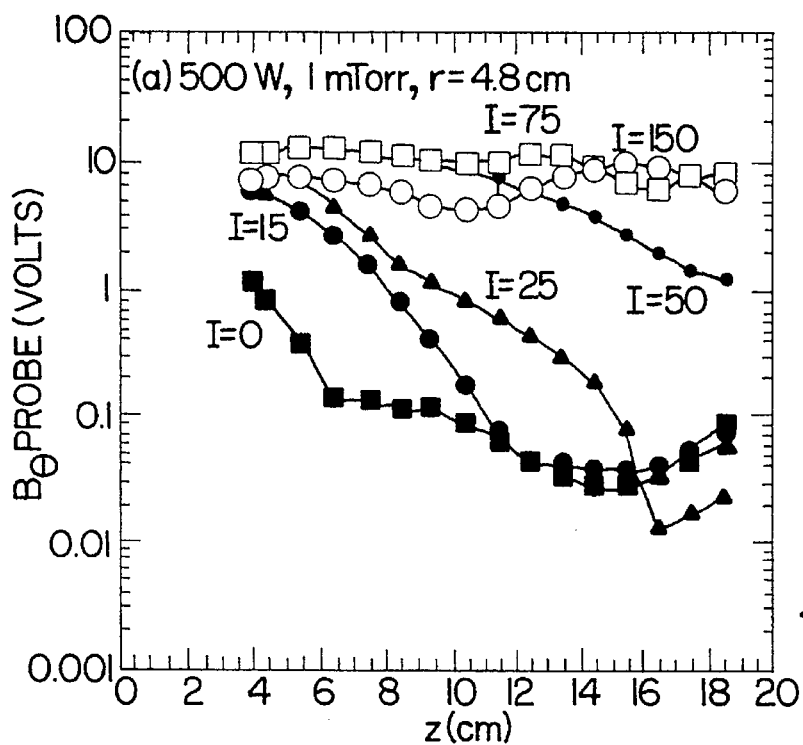
FIGS. 8a and 8b are graphs illustrating axial scans of $B_\theta$-probe voltage (peak-to-peak) versus coil current with (a) pressure=1 mTorr and (b) 25 mTorr, respectively.

FIG. 8a is a plot of peak-to-peak $B_\theta$-probe voltage versus axial distance for several coil currents (magnetic fields) with a pressure of 1 mTorr. The axial scans were measured at r=5 cm. It was assumed, from the data in FIG. 6b, that most of the damping at 1 mTorr in FIG. 8a is due to a collisionless mechanism. The damping in FIG. 8a increases strongly at low magnetic fields (I<75 A or $B_{win}$<30 G), while the I=75 A and I=150 A data show relatively little attenuation of the $B_\theta$ field. The standing wave patterns in the amplitude for the I=75 and 150 A cases where the damping is weak is noted. This standing wave is believed due to helicon mode reflection off the wafer platen.

Figure 8B:
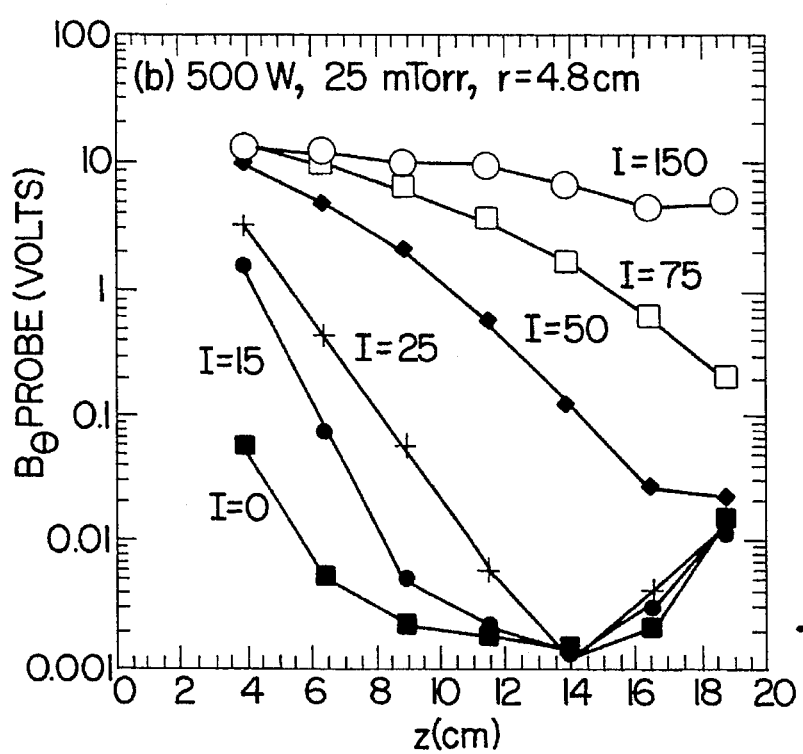

FIG. 8b is the same plot as FIG. 8a except for the pressure of 25 mTorr versus 1 mTorr in FIG. 8a. It is note that the attenuation of the $B_\theta$-signal is much stronger for the high pressure case at currents below approximately 150 A ($B_{win}/B_{res}$<12). This suggests that collisional damping is dominating for p=25 mTorr and I<150 A ($\upsilon_c/\omega_{ce} > 0.3$).

Figure 9A:
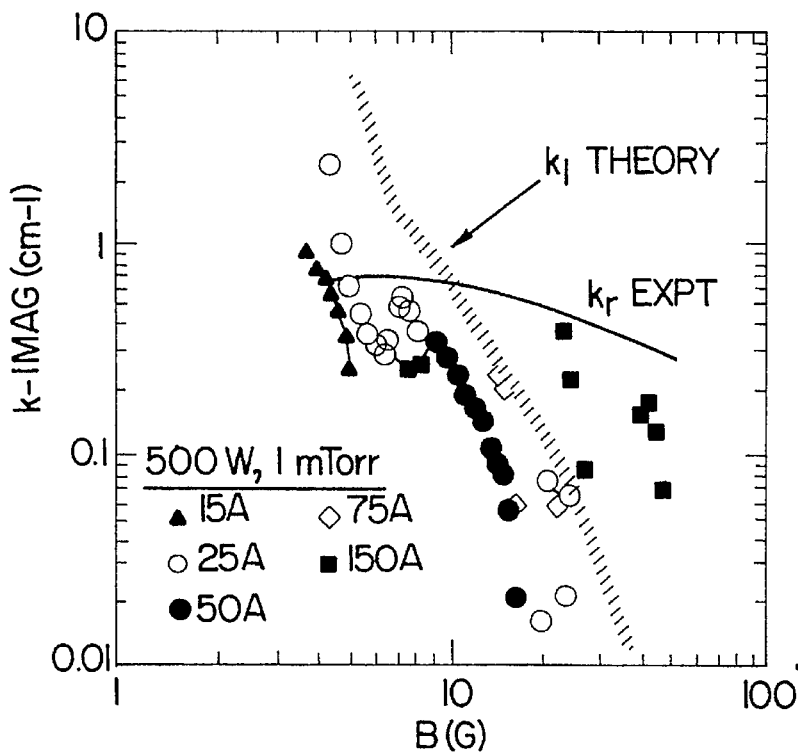
FIGS. 9a and 9b are graphs illustrating the imaginary wavenumbers $k_i(cm^{-1})$ for the data illustrated in FIGS. 8a and 8b, respectively, plotted versus magnetic field, along with theoretical value (dashed line) and the measured real wavenumber $k_r$ (solid line)

FIG. 9a shows $k_{\parallel if}$ for the 1 mTorr data in FIG. 8a plotted versus the local magnetic field. Damping at a pressure of at 1 mTorr ($\upsilon_c/\omega \approx 0.14$) should be mostly collisionless as seen in FIG. 6b. FIG. 9a indicates that the collisionless damping becomes stronger as the magnetic field approaches the ECR resonance field of approximately 4.8 G, but is quite significant ($k_{\parallel if}=0.2$ cm$^{-1}$) even at 20 G. The large scatter for the I=75 A and I=150 A data are due to the presence of the standing wave pattern which makes estimates of the local damping rate uncertain. A theoretical estimate of the linear damping based on Eqs. 3–4 is plotted as the dashed line in FIG. 9a, using the measured $k_\parallel$ values also plotted in the figure. The experimentally measured damping is approximately a factor of two weaker than expected from linear wave theory.

Figure 9B:
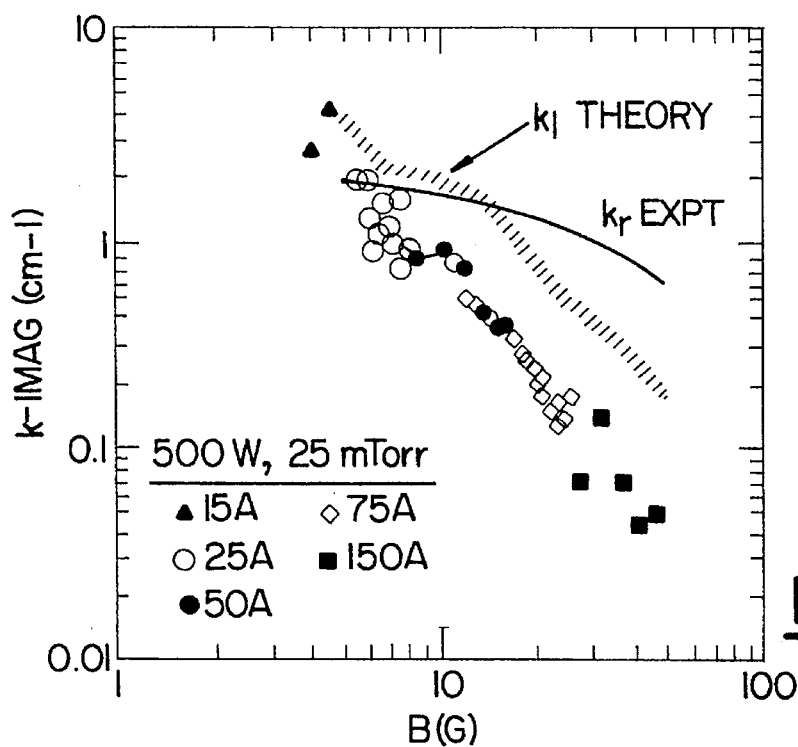

FIG. 9b shows $k_{\parallel if}$ for the 25 mTorr data of FIG. 8b where collisional damping should dominate ($\upsilon_c/\omega \approx 3.3$). The measured damping is stronger than the 1 mTorr data but is again more than a factor of two weaker than expected from the theory given by Eqs. 2–4. The discrepancy with theory is not unreasonable considering the uncertainties in the data such as small $B_0$-profile changes with axial position, radially nonuniform magnetic fields at a given axial position, and the fact that some nonlinear saturation mechanism may apply to the high power situation of this experiment.

Figure 10A:
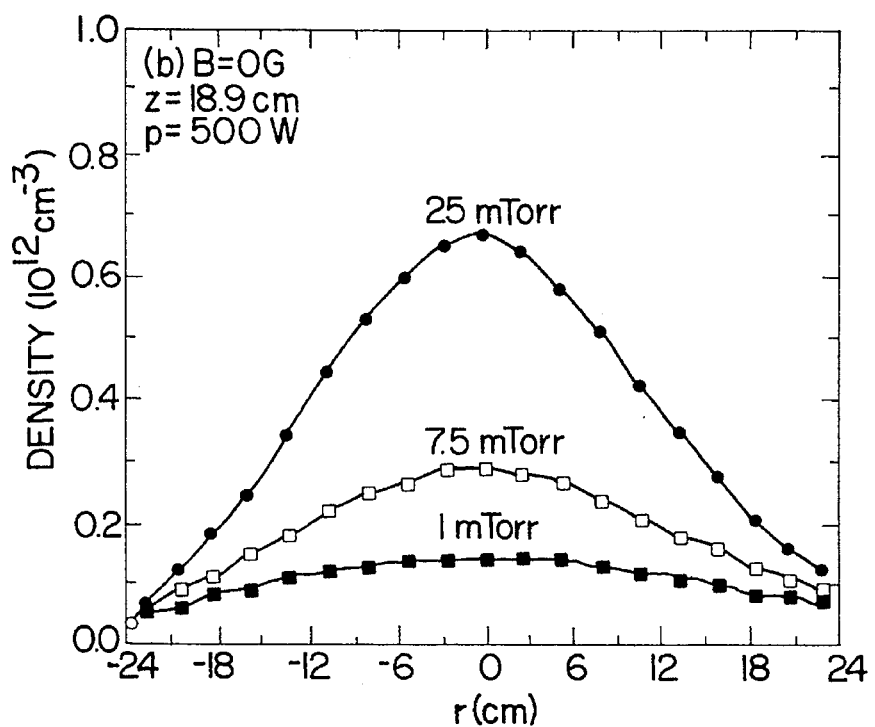
FIGS. 10a and 10b are graphs illustrating density profiles versus (a) field and (b) pressure magnetic, respectively.
Figure 10B:
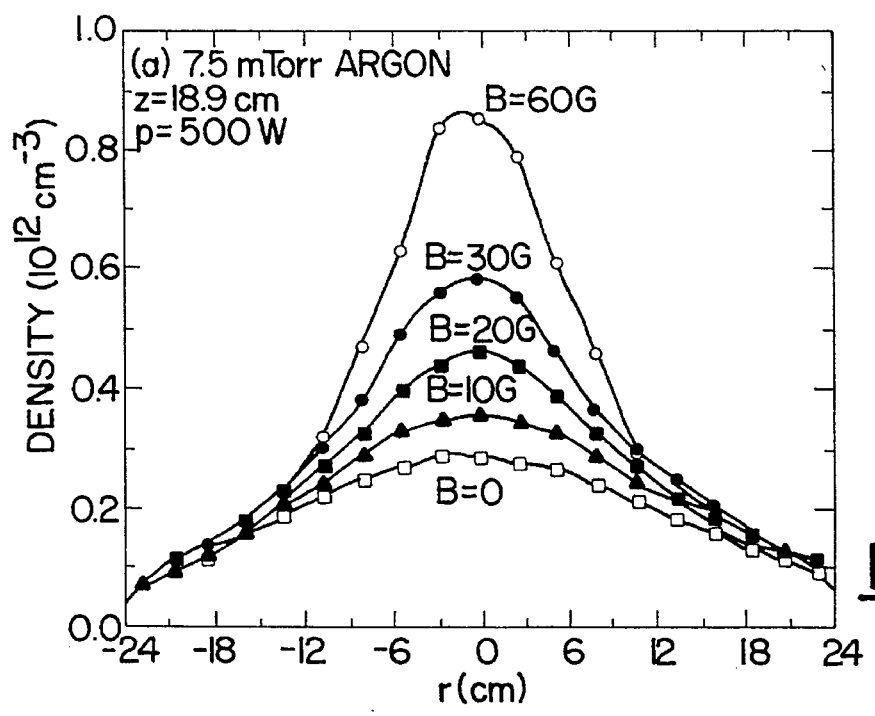

Plasma density profiles at z=18.9 cm from the window were measured with a Langmuir probe biased at –60 V and normalized to the line average density measured with a 35 GHz interferometer. FIG. 10a shows that the density increases and the density profiles become more peaked as the window magnetic field increases. This is likely due to both the radial confining effect of the field as well as to the centrally deposited power of the m=0 helicon mode structure. FIG. 10b shows that the density increases with pressure and the density profile becomes more peaked. The peak density of $n_e \approx 5.8\times10^{11}$ cm$^{-3}$ for the 7.5 mTorr, B=30 G case compares well with $n_e=5\times10^{11}$ cm$^{-3}$ inferred from the helicon dispersion equation and the 7.5 mTorr data of FIG. 6b.

The overall loading of the flat RF coil does not change significantly with magnetic field and pressure and the small changes can be easily handled by the match network. Estimates of the loading can be made from the variable capacitor settings of the match network. The RF coil reactance is the dominant contribution to the load seen by the match network. The unloaded coil has an inductance of approximately 2.8 μH. The plasma-loaded inductance of the RF coil is approximately 1.6 μH and varies by approximately 5% with pressure and magnetic field. It is estimated that capacitive coupling to the plasma makes an approximately 15% contribution to the plasma-loaded reactance of the system. The plasma-loaded RF coil resistance ranges from 1.5–7 Ω for the pressure range of 1 and 25 mTorr and magnetic fields between 0 and 10 $B_{res}$ (0–50 G). The rf coil resistance generally increases with pressure and magnetic field.

Discussion

The amplitude of the measured wave $B_\theta$-fields integrated over radius correspond to values expected from Eq. (10), implying that the helicon wave fields represent most of the RF power coupled into the reactor. Thus, the attenuation of the $B_\theta$-probe signals represent where the RF power is being deposited in the plasma.

The automatic match network was most stable in the range 15 A<I<75 A, while the match had a slow (approximately 1 sec) time oscillation for I=0 and I>75 A. The instability for I>75 A can be explained by the fact that significant helicon mode power can propagate through the plasma, reflect off the substrate platen, and return to the antenna with a phase which depends on the plasma conditions. Thus, plasma density variations can affect the load seen by the coil.

The Poynting flux of the m=0 helicon mode is centered on axis [Eq. (10)] and the plasma density is also peaked on axis. The density profile becomes more peaked with magnetic field. The addition of a multipole bucket or quadruple solenoid field as in the MORI source are known ways which can improve the plasma uniformity. Buckets filled by a divergent field ECR source have produced good uniformity, T. Mantei, et al., *J.Vac.Sci.Technol.* B9, 29 (1991), and it is believed that the same concept should also work for the much weaker axial fields of this reactor. It was also noted that the dc magnetic field is sufficiently weak that it could be supplied by permanent magnets, T. Mantei, et al., *J.Vac.Sci.Technol.* B9, 26 (1991), in place of a solenoid.

Absorption of the 13.56 MHz RF power occurs via collisional damping at high pressures (p>7 mTorr) and via collisionless Landau or ECR damping at lower pressure. This end launch configuration differs from previous helicon sources in that the parallel wavelength is not defined by the antenna. Advantages of this configuration are that the RF power absorption and the plasma generation are remote from the reactor walls, only a modest magnetic field is required, and the configuration is compact. This reactor configuration allows the aspect ratio (height/diameter) to be increased compared to a purely inductively coupled reactor without sacrificing plasma density at the substrate. Larger aspect ratio could have processing advantageous for pumping speed, reaction product exhaust, and control of the wall chemistry.

The apparatus and process of the invention provide an end launch configuration for a helicon source, helicon operation without a separate source region, and a combination of collisionless Landau and ECR damping of the helicon mode for fields less than 20 Gauss. The transition from collisionless to collisional damping is also demonstrated around $\upsilon_c \approx \omega_{ce}$ as the pressure is increased, where $\upsilon_c$ is an average electron-neutral and electron-ion collision frequency, $\omega_{ce}=$ eB/$m_e$c is the electron cyclotron frequency, e and $m_e$ are the electron charge and mass, c is the speed of light, and B is the magnetic field strength.

The foregoing example is illustrative of the present invention, and is not to be construed as limiting thereof. The invention is defined by the following claims, with equivalents of the claims to be included therein.

That which is claimed is:

1. An apparatus for producing a plasma comprising:

a processing chamber;

gas supplying means for supplying gas to said processing chamber;

a radio frequency power source;

an electrically conductive planar antenna located outside of said processing chamber and electrically coupled to said radio frequency power source to generate a helicon wave in said processing chamber and thereby produce a plasma of a gas in said processing chamber; and magnetic field generating means located outside of said processing chamber for generating a magnetic field within said processing chamber, said magnetic field generating means generating a magnetic field within said chamber substantially perpendicular to the plane of said planar antenna, the magnetic field causing elongation of said plasma in said processing chamber.

2. The apparatus of claim 1 wherein said planar antenna is a electrically conductive planar coil.

3. The apparatus of claim 2 wherein said coil is a spiral coil.

4. The apparatus of claim 2 wherein said coil is a series of concentric rings.

5. The apparatus of claim 2 wherein said coil is a double spiral.

6. The apparatus of claim 1 wherein said magnetic field generating means generates a magnetic field of greater than 5 Gauss strength in said processing chamber when said radio frequency power source operates at a frequency of 13.5 MHz.

7. An apparatus for producing a plasma comprising:
a processing chamber having first and second opposing ends;
a dielectric window in said first opposing end;
a substrate support adjacent said second opposing end;
a gas inlet which supplies gas to said processing chamber;
a radio frequency power source;
an electrically conductive planar antenna located outside said chamber, adjacent said dielectric window and electrically connected to said radio frequency power source to generate a helicon wave through said dielectric window into said processing chamber and produce a plasma of a gas in said processing chamber, said plasma having a first thickness between said dielectric window and said substrate support; and
an electromagnet coil located outside said processing chamber, and extending parallel to said electrically conductive planar antenna, to generate a magnetic field within said processing chamber which elongates said plasma to a second thickness which is greater than said first thickness.

8. The apparatus of claim 7 wherein said dielectric window and said substrate support also extend parallel to said electrically conductive planar antenna and said electromagnet coil.

9. The apparatus of claim 8 wherein said dielectric window, said substrate support, said electrically conductive planar antenna and said electromagnet coil each define collinear axes.

10. The apparatus of claim 9 wherein said processing chamber defines an axis which is collinear with said collinear axes.

11. The apparatus of claim 7 wherein said planar antenna is a electrically conductive planar coil.

12. The apparatus of claim 11 wherein said coil is a spiral coil.

13. The apparatus of claim 11 wherein said coil is a series of concentric rings.

14. The apparatus of claim 11 wherein said coil is a double spiral.

15. The apparatus according to claim 7 wherein said magnetic field generating means generates a magnetic field of greater than 5 Gauss strength in said processing chamber when said radio frequency power source operates at a frequency of 13.5 MHz.

16. A process for treating a substrate with a plasma, comprising:
placing a substrate within a processing chamber;
introducing a processing gas into the processing chamber;
energizing a planar antenna located outside said processing chamber with radio frequency power to generate a helicon wave in said processing chamber and thereby produce a plasma of said processing gas in said processing chamber; and
elongating the plasma of said processing gas in said processing chamber by generating a magnetic field within said processing chamber substantially perpendicular to said substrate, such that said helicon wave is propagated along the magnetic field.

17. The process of claim 16 wherein said energizing step and said elongating step are performed simultaneously.

18. The process of claim 16 wherein said step of generating a magnetic field within said processing chamber comprises the step of generating a magnetic field of greater than 5 Gauss strength in said processing chamber when said radio frequency power source operates at a frequency of 13.5 MHz.

* * * * *